US006954678B1

(12) United States Patent
Phan et al.

(10) Patent No.: US 6,954,678 B1
(45) Date of Patent: Oct. 11, 2005

(54) ARTIFICIAL INTELLIGENCE SYSTEM FOR TRACK DEFECT PROBLEM SOLVING

(75) Inventors: Khoi A. Phan, San Jose, CA (US); Bhanwar Singh, Morgan Hill, CA (US); Bharath Rangarajan, Santa Clara, CA (US); Ramkumar Subramanian, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 50 days.

(21) Appl. No.: 10/261,650

(22) Filed: Sep. 30, 2002

(51) Int. Cl.[7] .................. G06F 19/00; G01R 31/26
(52) U.S. Cl. .................. 700/121; 700/110; 438/5; 438/14; 702/45
(58) Field of Search .................. 700/121, 47, 48, 700/96, 108–110; 438/5, 14; 702/58; 706/14, 706/45

(56) References Cited

U.S. PATENT DOCUMENTS

| | | | | |
|---|---|---|---|---|
| 4,712,057 A | * | 12/1987 | Pau | 250/310 |
| 5,256,204 A | | 10/1993 | Wu | |
| 5,311,562 A | * | 5/1994 | Palusamy et al. | 376/215 |
| 5,355,306 A | * | 10/1994 | Waldo, III | 700/59 |
| 5,372,471 A | | 12/1994 | Wu | |
| 5,544,256 A | * | 8/1996 | Brecher et al. | 382/149 |
| 5,737,739 A | * | 4/1998 | Shirley et al. | 715/512 |
| 5,772,814 A | * | 6/1998 | Grewell | 156/64 |
| 5,960,185 A | * | 9/1999 | Nguyen | 716/9 |
| 6,106,167 A | | 8/2000 | Gao et al. | |
| 6,110,843 A | * | 8/2000 | Chien et al. | 438/782 |
| 6,185,511 B1 | * | 2/2001 | Steffan et al. | 702/81 |
| 6,298,470 B1 | * | 10/2001 | Breiner et al. | 716/4 |
| 6,392,229 B1 | | 5/2002 | Dana et al. | |
| 6,442,445 B1 | * | 8/2002 | Bunkofske et al. | 700/108 |
| 6,535,865 B1 | * | 3/2003 | Skaaning et al. | 706/52 |
| 6,583,509 B2 | * | 6/2003 | Nulman | 257/773 |
| 6,594,024 B1 | * | 7/2003 | Singh et al. | 356/630 |
| 6,633,831 B2 | * | 10/2003 | Nikoonahad et al. | 702/155 |
| 6,665,425 B1 | * | 12/2003 | Sampath et al. | 382/112 |
| 6,753,261 B1 | * | 6/2004 | Phan et al. | 438/706 |
| 2001/0011260 A1 | * | 8/2001 | Skaanning et al. | 706/46 |
| 2002/0078429 A1 | * | 6/2002 | Yoshida | 716/21 |
| 2004/0044431 A1 | * | 3/2004 | Pellegrini et al. | 700/121 |

OTHER PUBLICATIONS

Lithography Defects: Reducing and Managing Yield Killers through Photo Cell Monitoring, By: Ingrid Peterson, Gay Thompson, Tony Dibiase, Scott Ashenaz, Yield Management Solutions, Summer 2000, 8 pages.

Production QC and Tool Monitoring Using anAUtomated Macro ADI Defect Inspection System, Yield Management Solutions, summer 2000, 4 pages.

Defect Management for 300mm and 130 mm Technologies Part 2: Effective Defect Management in the Lithography Cell, , Yield Management Solutions, Fall 2001.

* cited by examiner

Primary Examiner—Paul Rodriguez
(74) Attorney, Agent, or Firm—Amin & Turocy, LLP

(57) ABSTRACT

A system and method facilitating lithography defect solution generation is provided. The invention includes a defect solution component and a defect alert component. The defect solution component provides potential solution(s) to a defect within the lithography process utilizing artificial intelligence technique(s) (e.g., Bayesian learning methods that perform analysis over alternative dependent structures and apply a score, Bayesian classifiers and other statistical classifiers, including decision tree learning methods, support vector machines, linear and non-linear regression and/or neural network).

31 Claims, 12 Drawing Sheets

ARTIFICIAL INTELLIGENCE SYSTEM FOR TRACK DEFECT PROBLEM SOLVING

TECHNICAL FIELD

The present invention relates generally to semiconductor processing and, more particularly, to a system and method to provide potential solution(s) to defect(s) within lithographic process(es) and/or lithography system(s) utilizing artificial intelligence technique(s).

BACKGROUND OF THE INVENTION

In the semiconductor industry, there is a continuing trend toward higher device densities. To achieve these higher device densities there have been, and continue to be, efforts toward scaling down the device dimensions on semiconductor wafers. This continuing trend has also led to advanced monitoring and quality control of the semiconductor manufacturing process.

High resolution lithographic processes are used to achieve small features. In general, lithography refers to processes for pattern transfer between various media. In lithography for integrated circuit fabrication, a silicon slice, the wafer, is coated uniformly with a radiation-sensitive film, the resist. The film is selectively exposed with radiation (such as optical light, x-rays, or an electron beam) through an intervening master template, the mask, forming a particular pattern (e.g., patterned resist). Exposed areas of the coating become either more or less soluble than the unexposed areas (depending on the type of coating) in a particular solvent developer. The more soluble areas are removed with the developer in a developing step. The less soluble areas remain on the silicon wafer forming a patterned coating. The pattern corresponds to the image of the mask or its negative. The patterned resist is used in further processing of the silicon wafer.

Within lithography, patterns are transferred from a mask or reticle onto a photoresist layer, which overlies the film on the wafer through an exposure process. If the mask or reticle consists of defect(s), even submicron in range, such defect(s) may be transferred to a wafer during the exposure. These defect(s) may be generated by the fabrication process utilized to produce the mask or reticle as well as during subsequent handling and processing. Such defect(s) generally fall into two classes: fatal (or killer) defect(s) and nonfatal defect(s).

Critical dimension(s) of the patterned resist, such as line widths, affect the performance of the finished product and are sensitive to processing conditions. Processing conditions that can affect critical dimensions include, for example, conditions relating to resist application, pre-baking, resist exposure, post-baking, and/or resist development. A few degrees variation in the pre-bake temperature, for example, can have a significant affect on critical dimension(s). Many of the conditions that affect critical dimensions can be difficult to control, often resulting in variations from batch to batch.

Controlling these variations within critical dimensions from batch to batch has become crucial in order to achieve higher device densities. Common micro and macro defects within the lithography process fall within the following categories: developer defects (e.g., scumming, developer spots, resist collapse, residue and no develop), contamination (e.g., particles and foreign materials), coating problems (e.g., comets, striations, spin, lifting, splash back and bubbles and no resist coat), focus and exposure defects (e.g., missing fields, focus error, gross misalign, gross blade errors and no exposure), edge-bead removal problems (e.g., missing, wrong width and miscentering), hot spots or focus spots and scratches (e.g., handling errors and tool misadjustment).

For example, contamination can be a serious problem. Particles or foreign materials have the ability to short or cause an open circuit in the formed circuitry upon the micrometer or even sub micrometer silicon wafer. Further, the particle can block processing chemicals from reaching portion(s) of the circuitry on the wafer during processing steps. Some contamination particles can lead to an unwanted electrical bridge from incomplete etching in spaces between lines. In addition, other contamination particle(s) may cause electrical failure due to induced ionization or trapping centers in gate dielectrics.

The categories and examples of defects above are just a few examples of the possible fatal and nonfatal defects. In order to control the possible defects, track systems are used within the industry of lithography. Track systems overcome the limitations of conventional stand-alone systems used in resist application, pre-baking, resist exposure, post-baking, and resist development. Also, track systems allow for easy accessibility of process modules, which reduces maintenance time, consistency of product and increase in productivity.

Techniques, equipment and monitoring systems have concentrated on preventing and decreasing defects within the lithography process. For example, aspects of the resist process which are typically monitored are: the correct mask has been used; resist film qualities are acceptable (e.g., resist is free from contamination, scratches, bubbles, striations, etc.); image quality is adequate (e.g., look for good edge definition, line width uniformity or indications of bridging); critical dimensions are within the specified tolerances; defect types and densities are recorded; and registration is within specified limits. The defect inspection task has progressed into an automated system based on both automatic image processing and electrical signal processing.

Within the lithography process, two automated areas of defect detection have been concentrated upon, electrical signal analysis and image analysis. By using an electrical signal analysis, defects such as opens in circuitry, unwanted electrical bridges and electrical failures can be detected within the silicon wafers. Image analysis can consist of the overlay inspection (OL) and the critical dimension inspection (CD), which are used to determine the quality of the lithography process. The OL inspection measures the registration of consecutive layers of multi-layer semiconductor chips. During the inspection, the wafer is moved to an optical microscope. Under this optical microscope the position of marks or targets of the previous processed layer are measured against the marks of the layer that is currently being added. The CD inspection measures the layer line widths. The layer is moved to a high-resolution CD-SEM (Critical Dimension Scanning Electron Microscopy) where the line width is measured and determined to be within a threshold or pre-determined tolerance.

Even with automatic defect detection systems, defects still arise in which a solution must be found. Solutions to the defects tend to be based on trial and error. A great deal of time and effort must be spent to troubleshoot the cause and to find a fix solution for each defect that may arise. The solution process is manually driven, very objective and hampered by human judgment errors.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides a system and method for providing potential solution(s) for defect(s) within the lithography process utilizing artificial intelligence technique(s). In accordance with an aspect of the present invention, a lithography defect solution system includes a defect solution component and a defect alert component.

The lithography defect solution system provides potential solution(s) to defect(s) within the lithography process utilizing artificial intelligence technique(s). In order to provide the potential solution(s), the defect(s) are analyzed in a manner appropriate for the detection technique used to detect the defect (e.g., electric signal and/or digital image). The defect is analyzed based on prior and/or known defects of the lithography process.

The defect solution component provides the potential solution(s) to the defect to the defect alert component based, at least in part, upon artificial intelligence technique(s). The defect solution component can analyze the received defect using knowledge of prior and/or known defect(s) (e.g., defect/solution pairs). Artificial intelligence technique(s) (e.g., Bayesian learning methods that perform analysis over alternative dependent structures and apply a score, Bayesian classifiers and other statistical classifiers, including decision tree learning methods, support vector machines, linear and non-linear regression and/or neural network) facilitate the search for potential solution(s) to the defect(s).

The defect alert component provides information associated with the defect and the potential solution(s) (e.g., to a user). The defect alert component can include an audible and/or visual alert, alerting the user and/or system of a defect and potential solution(s). The defect alert component can include input device(s) and/or output device(s).

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention may become apparent from the following detailed description of the invention when considered in conjunction with the drawings.

DETAILED DESCRIPTION OF THE INVENTION

Figure 1:
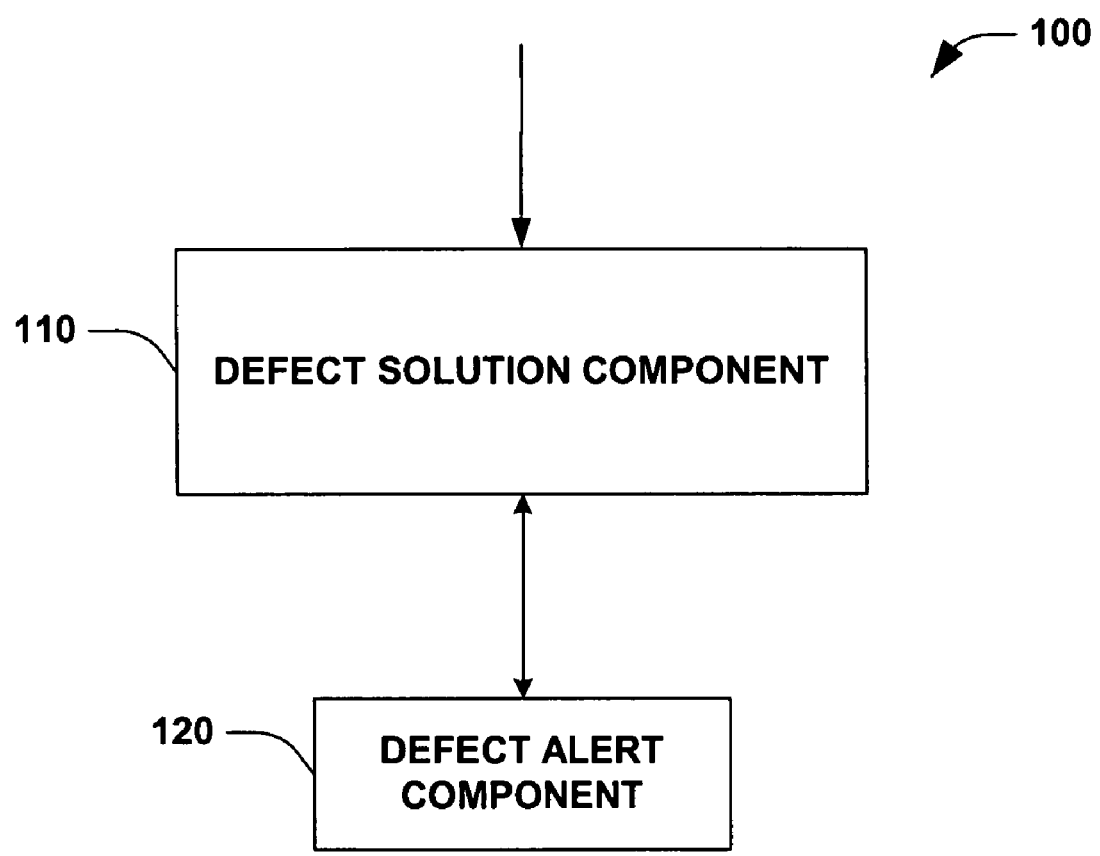
FIG. 1 is a block diagram of a lithography defect solution system in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the terms "component" and "system" are intended to refer to a computer-related entity, either hardware, a combination of hardware and software, software, or software in execution. For example, a component may be, but is not limited to being, a process running on a processor, a processor, an object, an executable, a thread of execution, a program, and a computer. By way of illustration, both an application running on a server and the server can be a component. One or more components may reside within a process and/or thread of execution and a component may be localized on one computer and/or distributed between two or more computers.

Referring to FIG. 1, a lithography defect solution system 100 in accordance with the present invention is illustrated. The lithography defect solution system 100 includes a defect solution component 110 and a defect alert component 120.

The lithography defect solution system 100 identifies potential solution(s) associated with a defect within the lithography process. The lithography defect solution system 100 employs artificial intelligence technique(s) to identify the potential solution(s) to the defect.

For example, an exemplary micro defect within the lithography process is a microbubble. A microbubble can generate a broken lead for a device on the wafer. Typically, this defect is caused by one of the following: resist dispense rate, ARC/resist interfacial interaction, or interaction between the substrate, primer and coating. Therefore, a great amount of time and energy can be put forth in order to troubleshoot and/or correct defect(s) caused by a microbubble to determine which of the causes created the defect. Although many microbubble defects may occur, each and every one may have a different solution to correct the defect. The possible solutions to the defect (e.g., developer spots, developer residue and comets) can be within a number of proposed solutions (e.g., improved exhaust in the developer cup, varying levels of resist-developer interaction, decrease contamination in the resist) but the way in which the solutions are performed may have numerous possibilities. For example, if a microbubble defect is found, the known cause could be the resist dispense rate. To correct the defect, however, there may be various combinations of the possible dispense rates that can correct the defect. In accordance with an aspect of the present invention, the lithography defect solution system 100 can receive the defect and then utilize artificial intelligence technique(s) to identify potential solution(s) to correct the defect. Although there may be many variations of microbubble defects, some share the same characteristics and also share the same solutions.

The defect solution component 110 identifies potential solution(s) associated with the defect. The defect solution component 110 employs artificial intelligence technique(s) to identify the potential solution(s). The defect solution component 110 is coupled to the defect alert component 120. For example, the defect solution component 110 and defect alert component 120 can be coupled by, but not limited to, a parallel electrical connection, a serial electrical connection, a cable television connection, a computer network connection (e.g., utilizing the Internet), a Digital Subscriber Line ("DSL"), a telephone line, a cable modem, a wireless data communications link and/or an integrated services digital network ("ISDN"). The defect alert component 120 provides information associated with the defect and the at least one potential solution. The artificial intelligence technique(s) (e.g., Bayesian learning methods that perform analysis over alternative dependent structures and apply a score, Bayesian decision-making methodology, Bayesian classifiers and other statistical classifiers, including decision tree learning methods, support vector machines, linear and non-linear regression and/or neural network) facilitate the search for the at least one solution to the defect(s).

In one example, the lithography defect solution system 100 is a stand-alone system. In another example, the lithography defect solution system 100 is a distributed system with the defect display 120 and the defect solution component 110 coupled via, for example, the Internet and/or a computer network.

The defect alert component 120 can include output device(s) (not shown) which display the defect and/or the potential solution(s). The output device(s) can include, for example, a computer monitor, a television screen, touch screen, speaker, telephone, and/or personal digital assistant (PDA). For example, the defect alert component 120 can employ an audio alert system that can provide an audible signal (e.g., a human voice) using a synthesizer and a speaker. The synthesizer can allow a reconstruction of the human voice, while a speaker can output the human voice notification of the defect and/or potential solution(s).

It is to be appreciated that the lithography defect solution system 100, the defect solution component 110 and/or the defect alert component 120 can be computer components as that term is defined herein.

Figure 2:
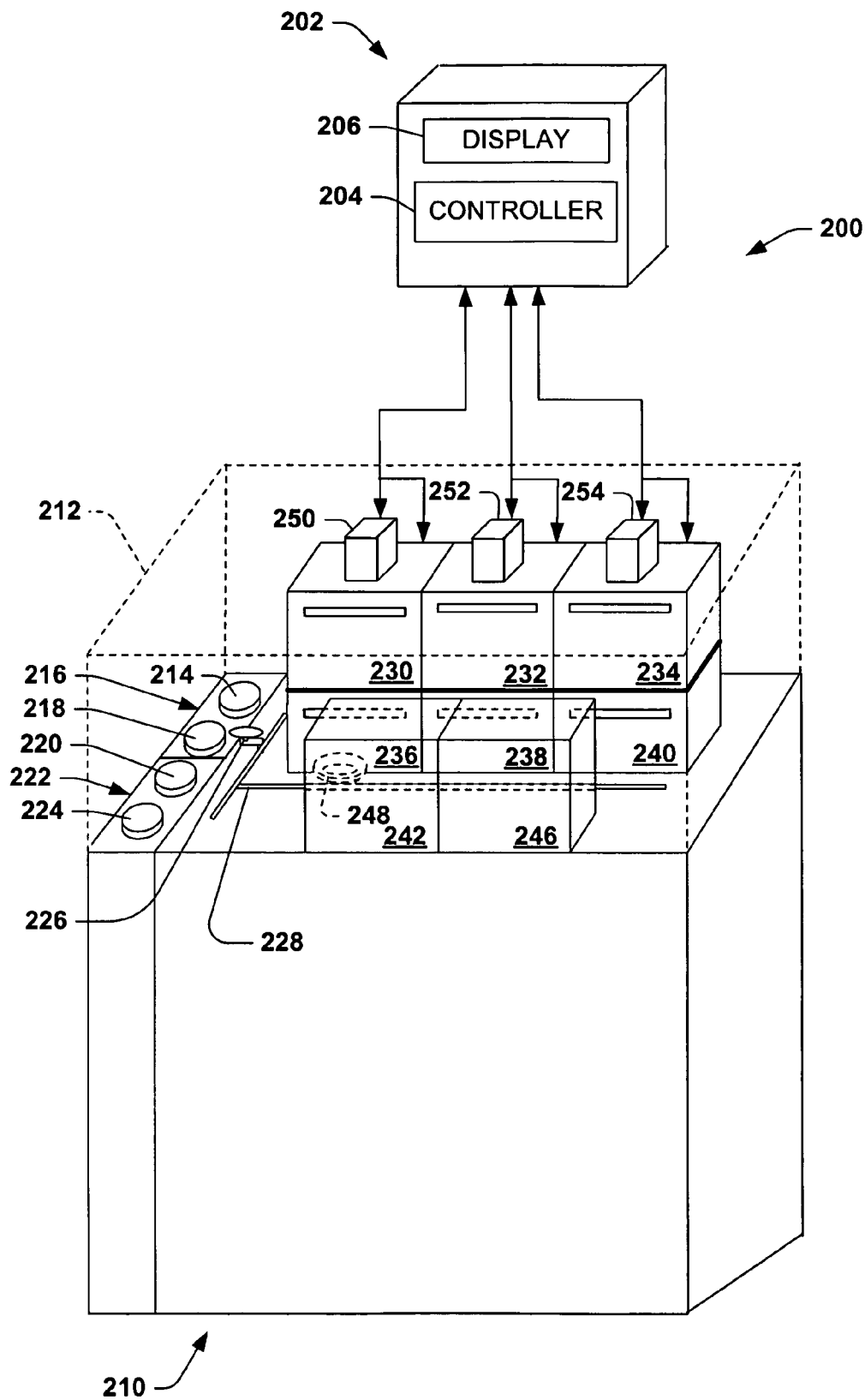
FIG. 2 is a perspective view of a prior art track system.

Turning to FIG. 2, a prior art system 200 for monitoring a plurality of processing units of an exemplary semiconductor processing track system 210 is illustrated. The track system 210 includes a plurality of process chambers 230, 232, 234, 236, 238, 240, 242 and 246. The process chambers can include a plurality of vertically stacked spin coater units and spin developer units. Other processing units can be provided for implementing other required processing steps within the track system 210. For example, unit 242 may be a baking unit (heater) and unit 246 may be a cooling unit (cooler) for selectively exposing a wafer to different controlled temperatures during the wafer fabrication process.

The track system 210 includes receiving and sending sections 222 and 216, respectively, for storing cassettes 214, 218, 220 and 224 of wafers at different stages of the fabrication process. The track system 210 also includes several robotically actuated transport arms 226 and 248. Each arm 226, 248 includes a tray having an upper surface for receiving a wafer. The arms move along tracks 228 or paths for transporting wafers between the storage cassettes and the processing units of the track system 210. Each of the processing units includes doors through which the wafers are transported. While two arms 226 and 248 are illustrated in FIG. 2, it will be appreciated that several more could be placed on the tracks 228 for moving wafers through the various parts of the coating, developing and stripping processes. Additional tracks also could be provided to facilitate wafer transport.

For example, the receiving section 222 includes one cassette 224 which contains bare wafers to which a photoresist material is to be applied or coated in a coater unit 236. The arms transfer a wafer from the cassette 224 to the coater unit 236 which, for example, coats a selected photoresist material onto the wafer surface. Another of the cassettes 220 stores resist-coated wafers that have been selectively exposed to radiation, such as during a lithography process. The arms transport a wafer from the cassette 220 to a selected developer unit 230 which develops and/or removes the exposed photoresist, such as by application of a solvent. The developer unit 230 includes a fluorescence spectrometry module 250 disposed above the developer unit for monitoring of the development of the exposed photoresist.

A controller 204 and a display 206 reside in a control station 202 for controlling and monitoring various operations of the track system 210. The display 206 is operatively coupled to the control system 204 for displaying a representation (e.g., graphical and/or text) of one or more process conditions, such as photoresist patterns, temperature, developer flow rates, etc. The display 206 further may show a graphical and/or textual representation of the measured pattern at various locations along the surface of the substrate.

The controller 204 is programmed to control operation of the fluorescence spectrometry module 250 and the development (e.g., development parameters) of the exposed photoresist. The fluorescence spectrometry module 250 transmits information to the controller, which can use this information to compare the actual patterned photoresist with an expected pattern and adjusts development parameters accordingly. The adjusted patterns can be used as feedback/feed forward information during development of the current wafer or as feedback/feed forward information for subsequent wafers and/or processes.

A second fluorescence spectrometry module 252 resides above another processing chamber 232. The processing chamber 232 can be a subsequent development chamber for further development of the photoresist based on inadequate development of the photoresist in the chamber 230. Alternatively, the chamber 232 can be a stripping chamber. The stripping chamber can employ either a plasma or chemical stripper. The second fluorescence spectrometry module 252 provides the controller 204 with information relating to the presence of photoresist material during and/or after the stripping process if the chamber 232 is a stripping chamber. The controller can then use this information to continue stripping, stop the stripping process or use the information as feedback/feed forward information for subsequent wafers and/or processes. The chamber 234 includes a fluorescence spectrometry module 254. The chamber 234 can be a first or second stripping chamber similar to that described above. If it is a second stripping chamber it can be employed to remove any remaining photoresist not removed in the first chamber.

The particular manner in which the controller 204 can be programmed will be readily apparent to those having ordinary skill in the art based on the description provided herein. It will be appreciated that the track system 210 of FIG. 2 could be integrated with a stepper system into an integrated processing system. Additional coater and/or developer units also could be incorporated into the track system 210 to further increase the throughput. Each of the units may be equipped with a fluorescence spectrometry module in accordance with the present invention.

Figure 3:
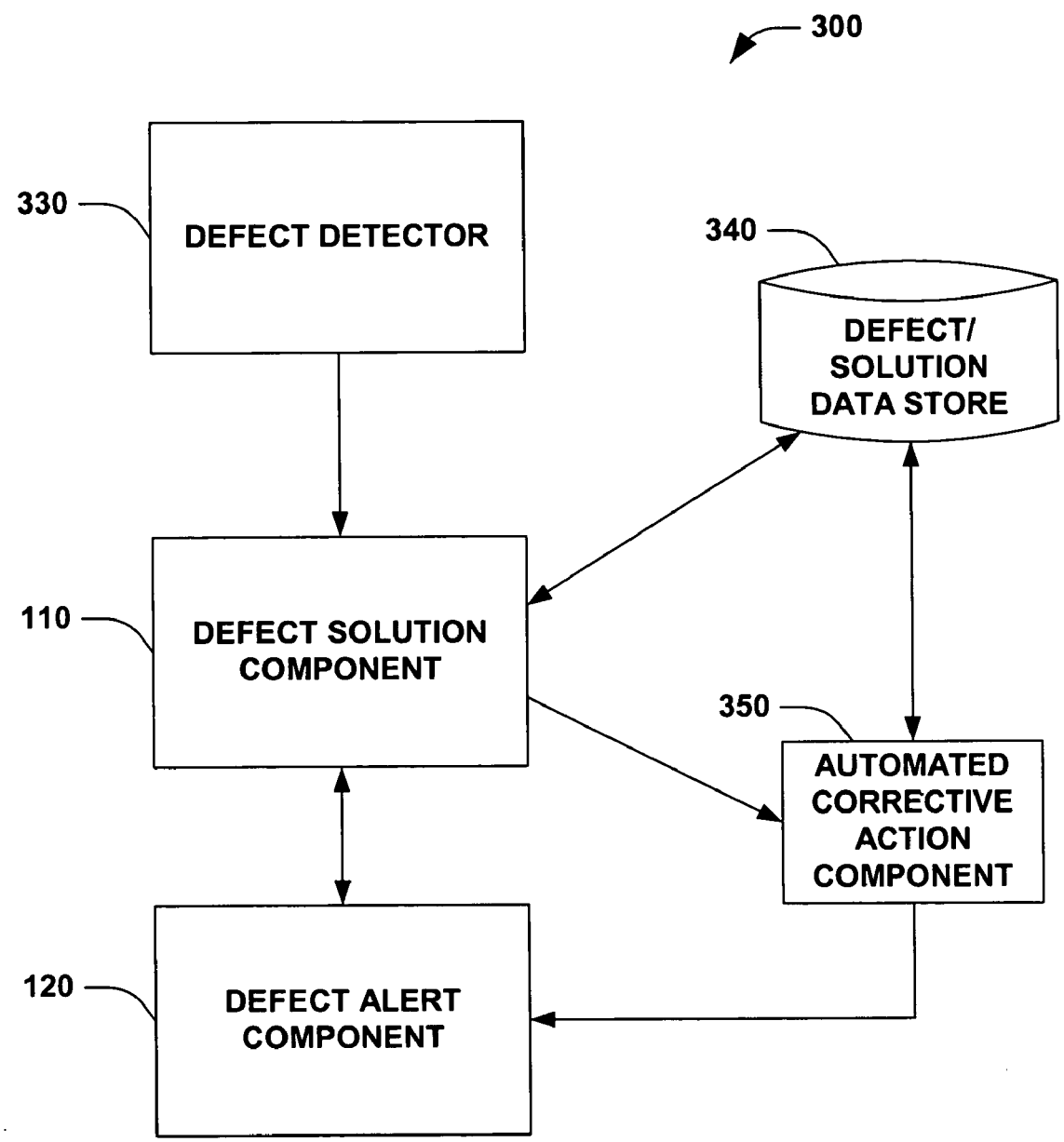
FIG. 3 is a block diagram of a lithography defect solution system in accordance with an aspect of the present invention.

Next, referring to FIG. 3, a lithography defect solution system 300 in accordance with an aspect of the present invention is illustrated. The lithography defect solution system includes a defect solution component 110 and a defect alert component 120. Optionally, the lithography defect solution system 300 can further include a defect detector 330, a defect/solution data store 340 and/or an automated corrective action component 350.

As discussed previously, the defect solution component 110 identifies at least one potential solution associated with a defect. The defect solution component 110 employs artificial intelligence technique(s) to identify the at least one potential solution. The defect solution component 110 is coupled to the defect alert component 120. The defect alert component 120 provides information associated with the defect and the potential solution(s) (e.g., to a user).

The defect detector 330 detects the defect. The defect detector 330 provides information associated with the defect to the defect solution component 110. The defect detector can perform, for example, electrical signal analysis and/or image analysis of a wafer in order to detect a defect. The defect detector 330 can be coupled to the defect solution component 110 to provide the information associated with the defect by, for example, a parallel electrical connection, a serial electrical connection, a cable television connection, a computer network connection (e.g., utilizing the Internet), a Digital Subscriber Line ("DSL"), a telephone line, a cable modem, a wireless data communications link and/or an integrated services digital network ("ISDN").

The defect/solution data store 340 stores information associated with a plurality of defects and/or associated potential solution(s). For example, defect/solution pair information for the lithography defect solution system 300 can be stored in the defect/solution data store 340. The defect/solution data store 340 can be coupled to the defect solution component 110.

In one example, the defect/solution data store 340 stores a list of typical defects and potential solution(s), thus facilitating training of the system 300. For example, using the artificial intelligence technique(s) discussed previously, the defect solution component 110 can be trained utilizing the stored list of typical defects and potential solution(s). The defect solution component 110 can then, when confronted with a defect not specially stored in the defect/solution data store 340, infer (e.g., utilizing Bayesian inference) potential solution(s) for the defect.

The automated corrective action component 350 facilitates automatic solution implementation. In one example, the lithography defect detection system 300 is an automatic system in which no substantial user interaction is necessary. For example, in a "manual operation mode", once a defect is found, the lithography defect solution system 300 provides potential solution(s) for the defect to a user who can then select the preferred solution from the potential solution(s). The automated corrective action component 350 facilitates reduction and/or elimination of this user interaction with the lithography defect solution system 300. The amount of automation within the lithography defect solution system 300 can be based, for example, upon user selection (e.g., fully automated, semi-automated and/or manual operation). For example, once a defect has been detected and potential solution(s) identified, in fully automated operation, the automated corrective action component 350 can initiate implementation of one or more of the potential solution(s) (e.g., based, at least in part, upon a calculated likelihood of correctness). Thus, potential solution(s) can be automatically selected and implemented by the automated corrective action component 350 without any substantial user interaction.

Figure 4:
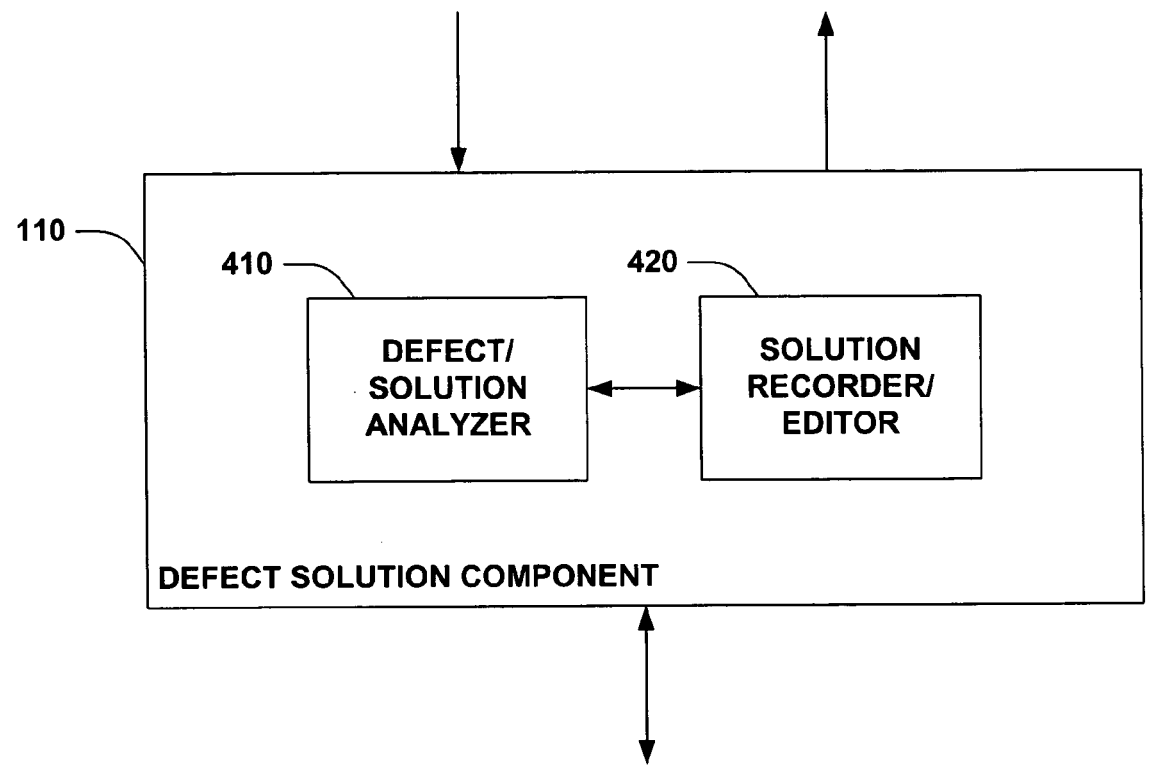
FIG. 4 is a block diagram of a lithography defect solution system in accordance with an aspect of the present invention.

Turning to FIG. 4, the defect solution component 110 can include a defect/solution analyzer 410 and/or a solution recorder/editor 420.

The defect/solution analyzer 410 provides the potential solution(s) for the defect. The defect/solution analyzer 410 can receive information associated with the defect. The defect/solution analyzer 410 can then employ artificial intelligence technique(s) (e.g., Bayesian learning methods that perform analysis over alternative dependent structures and apply a score, Bayesian classifiers and other statistical classifiers, including decision tree learning methods, support vector machines, linear and non-linear regression and/or neural network) to identify potential solution(s) to the defect. The defect/solution analyzer 410 can provide information associated with the likelihood that a potential solution is a correct solution (e.g., associated probability), rank potential solution(s) (e.g., based on historical defect information) and/or eliminate potential solution(s) (e.g., based on historical user information).

For instance, if defect/solution analyzer 410 identifies a defect A, in which the solution is known to be B, the defect/solution analyzer 410 can generally use solution B when defect A is found. However, when another defect C is found later in time, the defect/solution analyzer 410 can utilize artificial intelligence technique(s) to search for potential solution(s). In this example, assuming defect C is similar enough to defect A (e.g., determination based on artificial intelligence technique(s) discussed previously), the defect/solution analyzer 410 can rate solution B with a high ranking as a potential solution for the newly identified defect C. Thus, although defect C may not be the same as defect A, the defect solution analyzer 410 can employ artificial intelligence technique(s) to identify potential solution(s), in this example solution B.

The defect solution component 110 can further comprise a solution/recorder editor 420. The defect/solution analyzer 410 can be coupled to the solution recorder/editor 420. The solution recorder/editor 420 records potential solution(s) selected (e.g., by a user) for defect(s). The solution recorder/editor 420 can further facilitate editing of information associated with defects and/or potential solution(s) stored, for example, in the defect/solution data store 340. For example, the potential solution for a defect may not fully correct the defect. Therefore, a user can edit (e.g., delete) information stored in the defect/solution data store 340 via the solution recorder/editor 420.

In one example, when a defect is found, the defect/solution analyzer 410 can identify potential solution(s). A user and/or system can select a potential solution to implement for the defect. The solution recorder/editor 420 can then store information regarding the potential solution selected for the defect in the defect/solution data store 340. Based, at least in part, upon the user's action for a defect, the solution recorder/editor 420 can store information associated with the defect and selected potential solution(s).

In another example, a user can select from three actions: fix and learn, no fix, and fix and ignore. When the fix and learn action is chosen, the solution recorder/editor 420 can record the solution to the defect. This allows the user to guide the artificial intelligence technique(s) employed by the defect solution component 110 to learn potential solution(s) associated with defect(s).

In yet another example, information stored in the defect/solution data store 340 can be edited based on a user's preference(s) via the solution recorder/editor 420. For example, if a potential solution is identified and implemented but does not correct the defect to exact specification, the defect/solution data store 340 can be edited by the solution recorder/editor 420 to delete or modify the potential solution.

Figure 5:
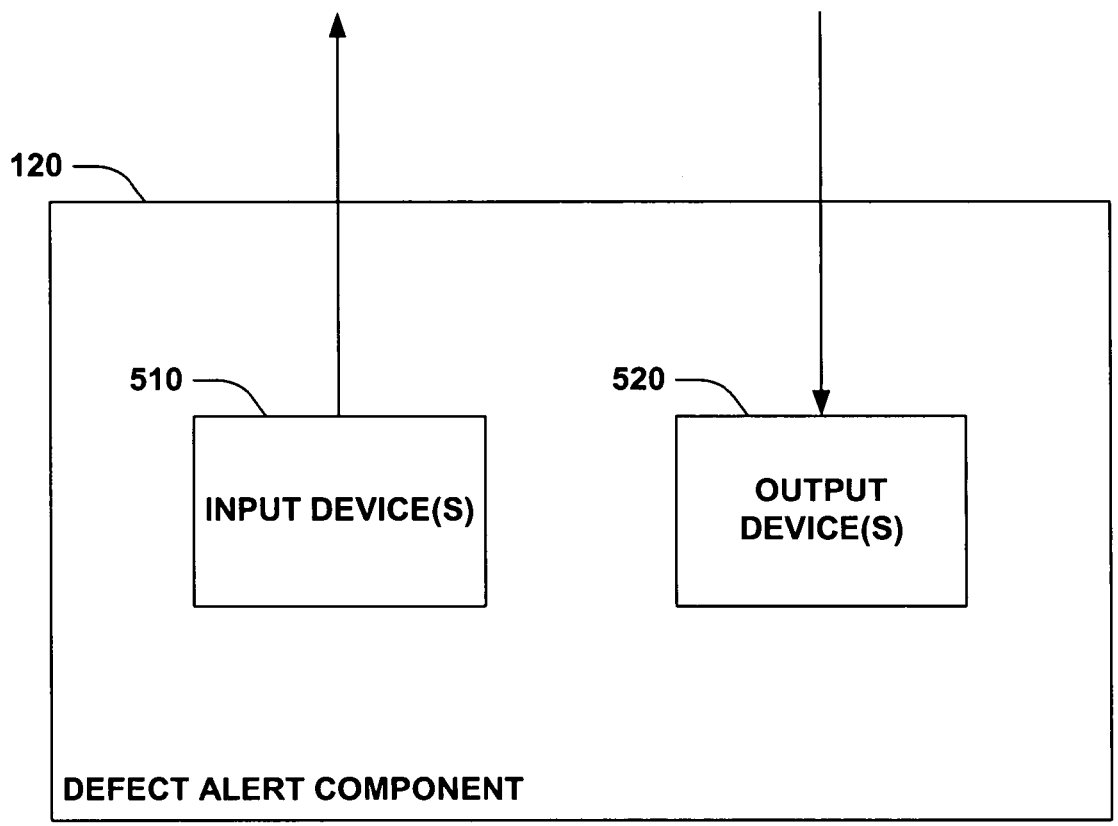
FIG. 5 is a block diagram of a defect alert component in accordance with an aspect of the present invention

Referring next to FIG. 5, the defect alert component 120 can include input device(s) 510 and/or output device(s) 520.

The input device(s) 510 allows for the receiving of input(s). For example, action(s) can be received from user(s) via the input device(s) 510. The input device(s) can be for example, a mouse, a microphone, a keyboard, a touch screen, a telephone and/or a PDA. The defect alert component 120 can provide information associated with the input(s) to the defect solution component 110, thus facilitating action(s) (e.g., disregard defect or correct defect) towards implementation of potential solution(s).

The output device(s) 520 provides information associated with a defect and/or potential solution(s) (e.g., to user(s)). For example, the information can include potential solution(s) and/or information associated with the status of the system 300. The output device(s) 520 can include, for example, a computer monitor, a television screen, a touch screen, a speaker, a telephone and/or a personal digital assistant.

Figure 6:
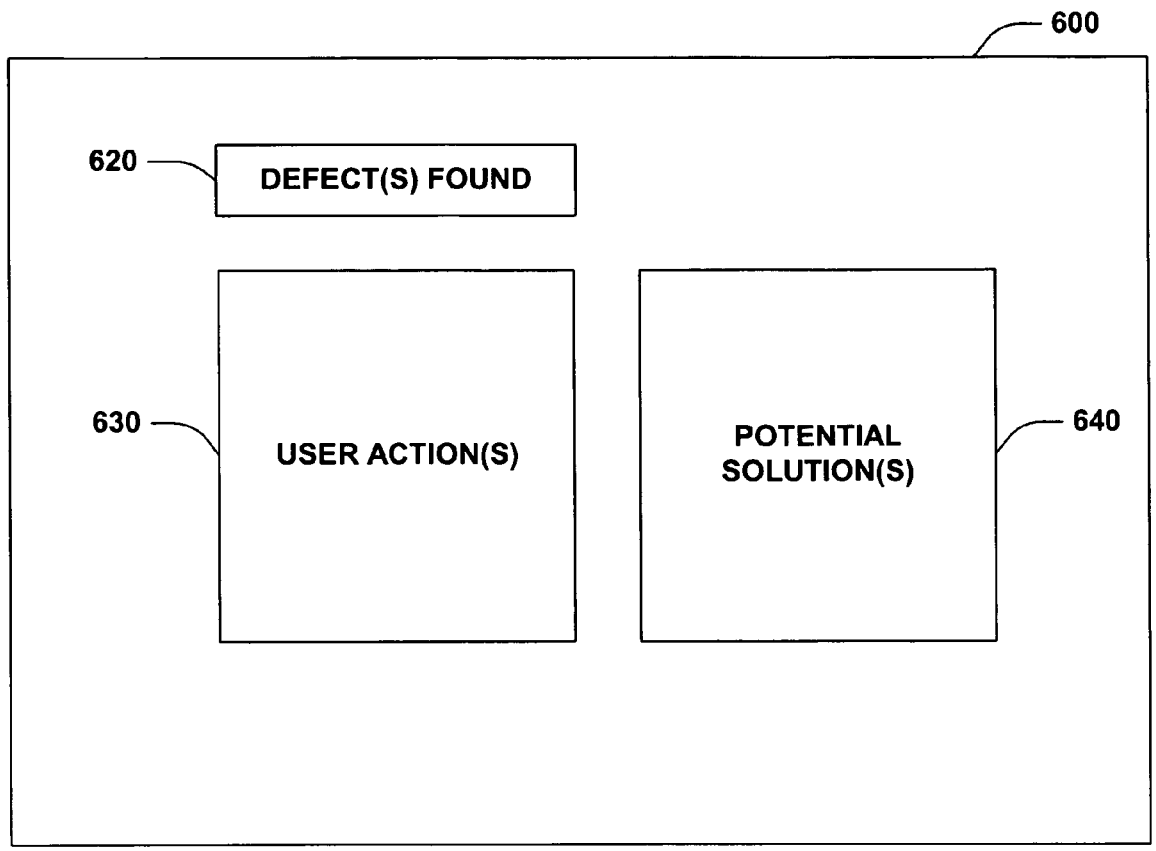
FIG. 6 is an exemplary user interface in accordance with an aspect of the present invention.

Turning to FIG. 6, an exemplary user interface 600 in accordance with an aspect of the present invention is illustrated. The user interface 600 includes a defect found field 620, a user action(s) field 630 and a potential solution(s) field 640.

When a defect is found, the defect found field 620 can display information associated with the defect. For example, if a microbubble defect is found, the defect found field 620 can display a message informing of the microbubble found. The defect found field 620 can provide information associated with the defect, for example, based on a priority of the defect using color (e.g., red for more serious defect(s), black for less serious defect(s)), size of text (e.g., larger text for more serious defect(s)) and/or blinking text to alert a user of a defect. Further, the defect found field 620 can further include information associated with how the defect was detected and/or when the defect was found (e.g., timestamp).

The user action(s) field 630 can provide information associated with user action(s) associated with the defect.

The potential solution(s) field 640 can provide information associated with potential solution(s) identified by the defect solution component 110. For example, the potential solution(s) field 640 can provide a list of potential solution(s) identified. Further, the potential solution(s) field 640 can provide information associated with a probability or likelihood that a particular potential solution is correct.

Figure 7:
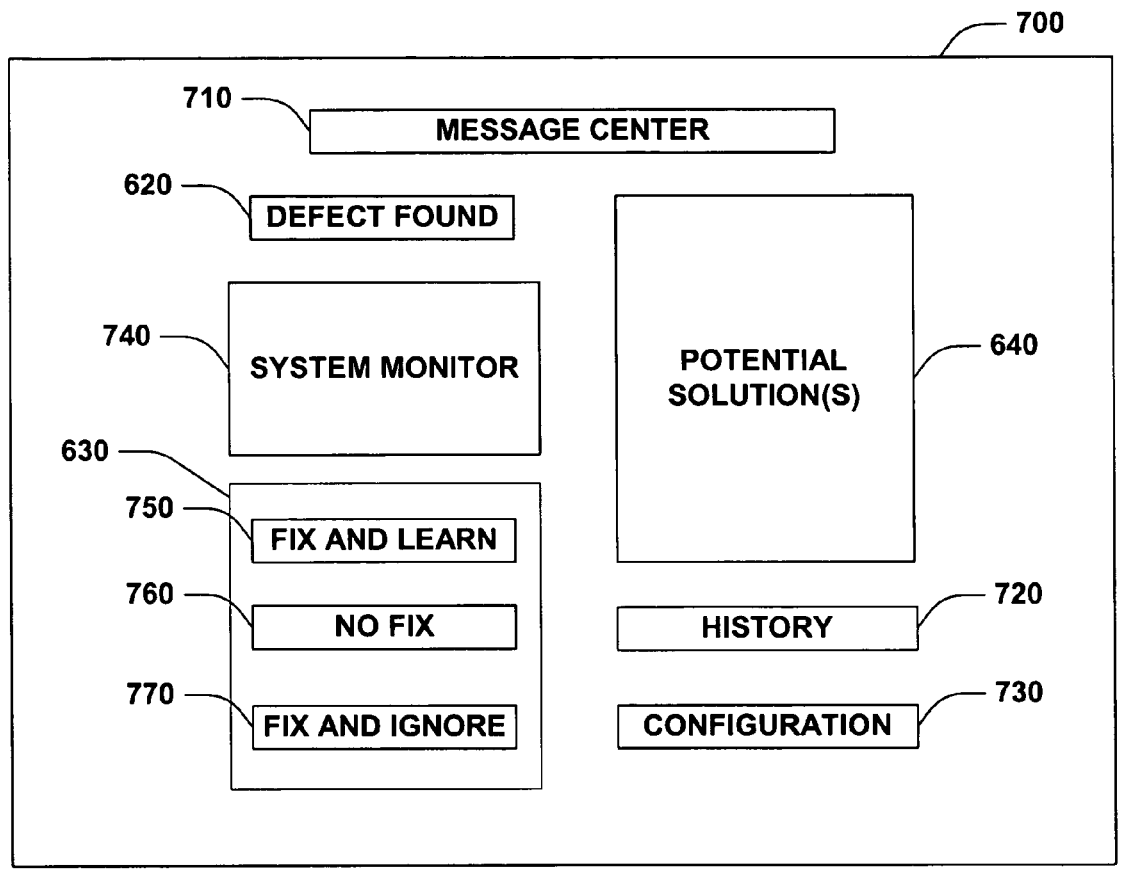
FIG. 7 is an exemplary user interface in accordance with an aspect of the present invention.

Referring next to FIG. 7, an exemplary user interface 700 in accordance with an aspect of the present invention is illustrated. The user interface 700 includes a defect found field 620, a user action(s) field 630 and a potential solution(s) field 640. The user interface 700 can further include a message center field 710, a history field 720, a configuration field 730 and/or a system monitor field 740.

The user action(s) field 630 can include a fix and learn field 750, a no fix field 760 and/or a fix and ignore field 770. The fix and learn field 750 facilitates correction of a defect with a selected potential solution and saves information associated with the defect and selected potential solution (e.g., in the defect/solution data store 340). The no fix field 760 enables the system to ignore and not correct the defect. The fix and ignore field 770 facilitates correction of the defect without saving information associated with the defect and selected potential solution. Thus, when a defect is found the potential solution can be: used and saved for future reference (e.g., fix and learn 750), ignored (e.g., no fix 760), used and not saved for future reference (e.g., fix and ignore 770).

The message center field 710 can display message(s) based, at least in part, on user preference(s). For example, the message center field 710 can display information associated with the lithography process (e.g., specific wafer label), current date and/or current time.

The system monitor field 740 can display system condition(s) within the lithography process, for example, temperature, mask identification, developer nozzle rate, resist interaction between substrate, exhaust rate in developer cup and resist-developer concentration. The system monitor field 740 can thus facilitate a user to be informed of the current system settings for the current wafer.

The history field 760 can facilitate presentation of information stored in the defect/solution data store 340 (e.g., previously selected potential solution(s) to defect(s)).

The configuration field 730 can facilitate manipulation of various aspects of the described components of the lithography defect solution system 300. For example, the configuration field 730 can allow a user to configure the user interface 700.

Further, the configuration field 730 can facilitate adjustment of setting(s) of the lithography defect solution system 300. For example, the configuration field 730 can facilitate threshold percentage(s) to be adjusted—to allow a more lenient listing of potential solution(s) or a stricter listing of potential solution(s). A user could desire the listing of potential solution(s) to be very close to the defect; therefore, the percentage of compatibility can be set relatively high. The configuration field 730 can further allow multiple users with individual passwords in order to save individual settings and added levels of security. The configuration field 730 thus allows configuration of preferences within the lithography defect solution system 300.

Figure 8:
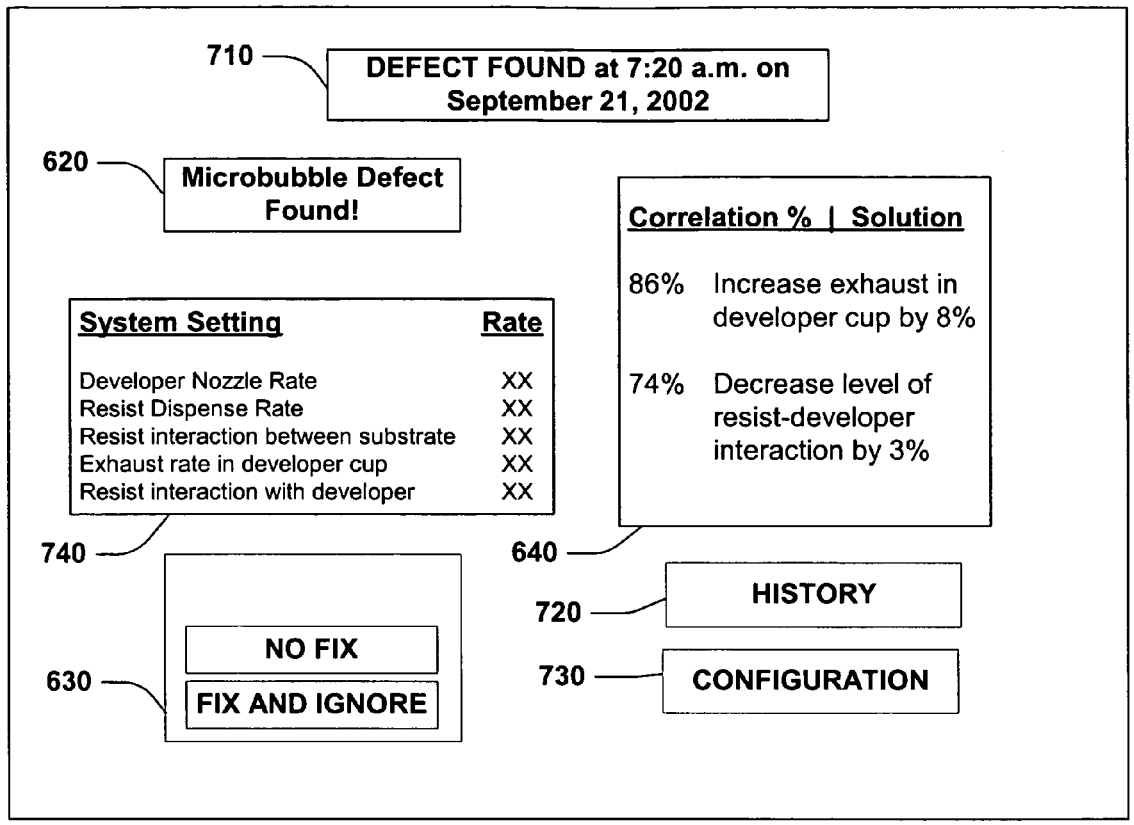
FIG. 8 is an exemplary user interface in accordance with an aspect of the present invention.

Next, referring to FIG. 8, a simulated user interface 800 in accordance with an aspect of the present invention is illustrated. The simulated user interface 800 displays a defect, the time and date associated with the defect within a message center field 710. Within a defect found field 620, a type of defect (e.g., microbubble defect found) is displayed to a user and/or remote system.

The simulated user interface 800 further provides potential solution(s) for the defect found (e.g., determined by the defect solution component 310, defect detector 330 and/or defect/solution data store 340) via a potential solution(s)

field 640. In this example, the potential solution(s) are displayed accompanied by a percentage of correlation to the defect.

A system monitor field 740 provides information associated with system setting(s) such as developer nozzle rate and resist dispense rate. The simulated user interface 800 further includes a history field 720, a configuration field 730 and a user action(s) field 630.

Simulated user interface 800 illustrates information that may be available to a user and/or remote system. It is to be appreciated that additional or less information may be made available to a user and/or remote system regarding the lithography process in accordance with the present invention.

Figure 9:
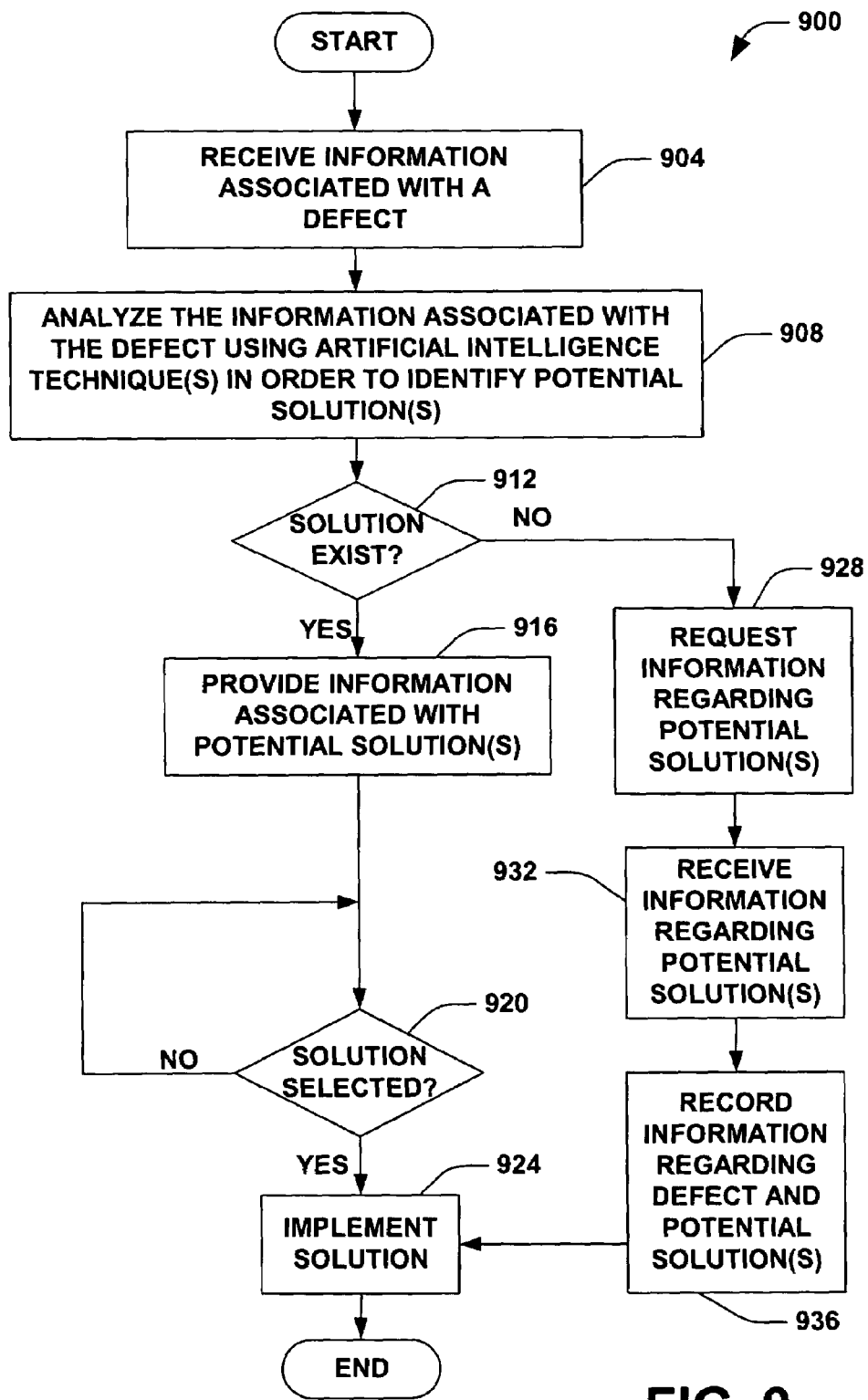
FIG. 9 is a flow chart illustrating a methodology for providing potential solution(s) related to a defect in accordance with an aspect of the present invention.
Figure 10:
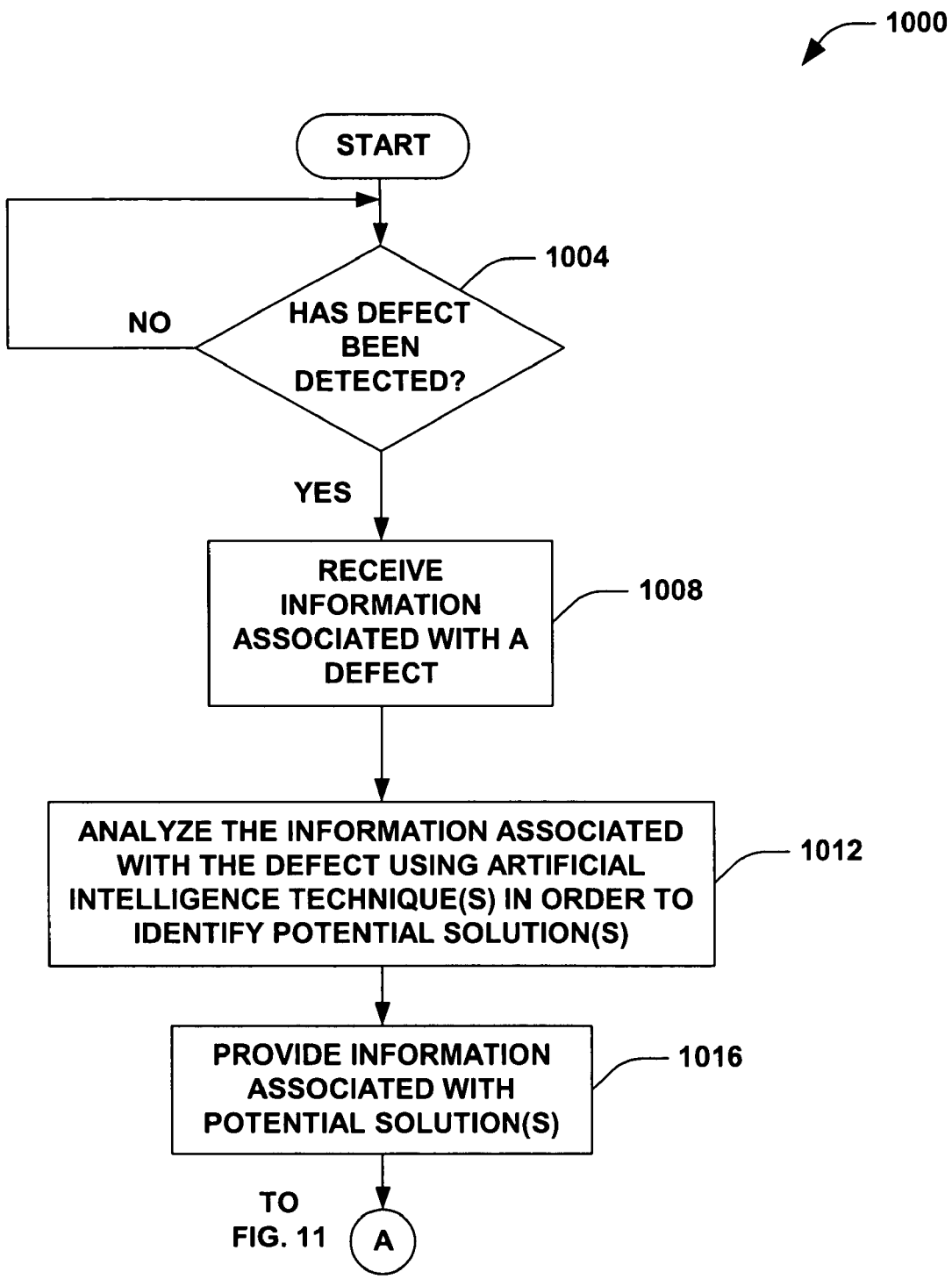
FIG. 10 is a flow chart illustrating a methodology for providing potential solution(s) related to a defect in accordance with an aspect of the present invention.
Figure 11:
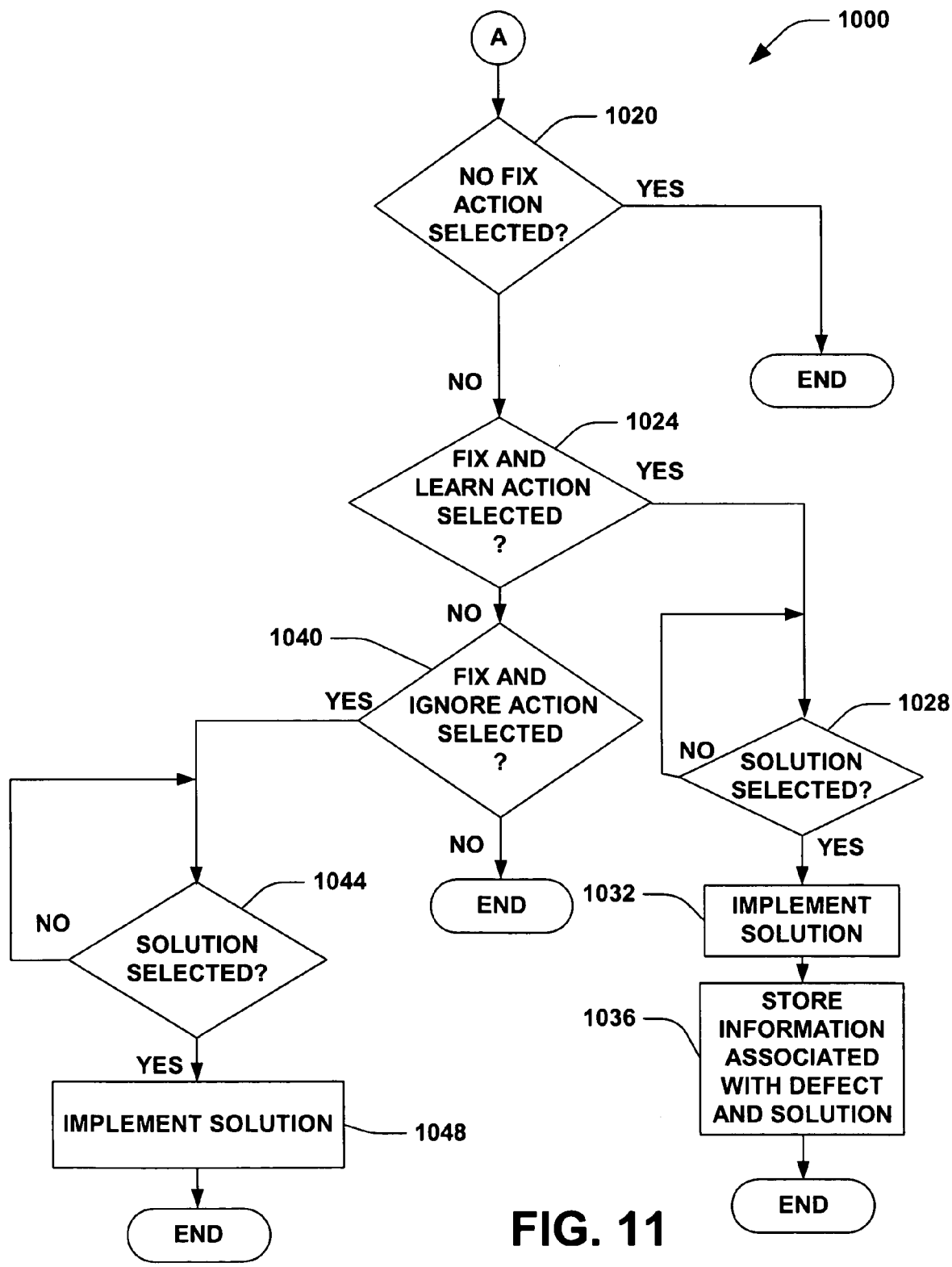
FIG. 11 is a flow chart further illustrating the methodology of FIG. 10.

Turning briefly to FIGS. 9, 10 and 11, methodologies that may be implemented in accordance with the present invention are illustrated. While, for purposes of simplicity of explanation, the methodologies are shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement the methodologies in accordance with the present invention.

The invention may be described in the general context of computer-executable instructions, such as program modules, executed by one or more components. Generally, program modules include routines, programs, objects, data structures, etc. that perform particular tasks or implement particular abstract data types. Typically the functionality of the program modules may be combined or distributed as desired in various embodiments.

Referring to FIG. 9, a methodology 900 for providing potential solution(s) to a defect in accordance with an aspect of the present invention is illustrated. At 904, information associated with a defect is received. At 908, the information associated with the defect is analyzed using artificial intelligence technique(s) in order to identify potential solution(s). At 912, a determination is made as to whether any potential solution(s) exist.

If the determination at 912 is YES, at 916, information associated with the potential solution(s) is provided (e.g., to a user). At 920, a determination is made as to whether a potential solution has been selected. If the determination at 920 is NO, processing continues at 920. If the determination at 920 is YES, at 924, the solution is implemented and no further processing occurs.

If the determination at 912 is NO, at 928, information regarding potential solution(s) is requested (e.g., from a user and/or remote system(s)). At 932, information regarding potential solution(s) is received. At 936, information regarding the defect and potential solution(s) is stored (e.g., stored in a defect/solution data store 340). At 928, a solution is implemented and no further processing occurs.

Turning to FIGS. 10 and 11, a methodology 1000 for providing potential solution(s) to a defect in accordance with an aspect of the present invention is illustrated. At 1004, a determination is made as to whether a defect has been detected. If the determination at 1004 is NO, processing continues at 1004. If the determination at 1004 is YES, at 1008, information associated with a defect is received. At 1012, the information associated with the defect is analyzed using artificial intelligence technique(s) in order to identify potential solution(s). At 1016, information associated with the potential solution(s) is provided (e.g., to a user and/or remote system).

At 1020, a determination is made as to whether a no fix action has been selected. If the determination at 1020 is YES, no further processing occurs.

If the determination at 1020 is NO, at 1024, a determination is made as to whether a fix and learn action has been selected. If the determination at 1024 is YES, at 1028, a determination is made as to whether a solution has been selected (e.g., by a user and/or remote system(s)). If the determination at 1028 is NO, processing continues at 1028. If the determination 1028 is YES, at 1032, the solution is implemented. At 1036 information associated with the defect and solution is stored (e.g., in a defect/solution data store 340) and no further processing occurs.

If the determination at 1024 is NO, at 1040, a determination is made as to whether a fix and ignore action has been selected. If the determination at 1040 is NO, no further processing occurs. If the determination at 1040 is YES, at 1044, at determination is made as to whether a solution has been selected. If the determination at 1044 is NO, processing continues at 1044. If the determination at 1044 is YES, at 1048, the solution is implemented and no further processing occurs.

Figure 12:
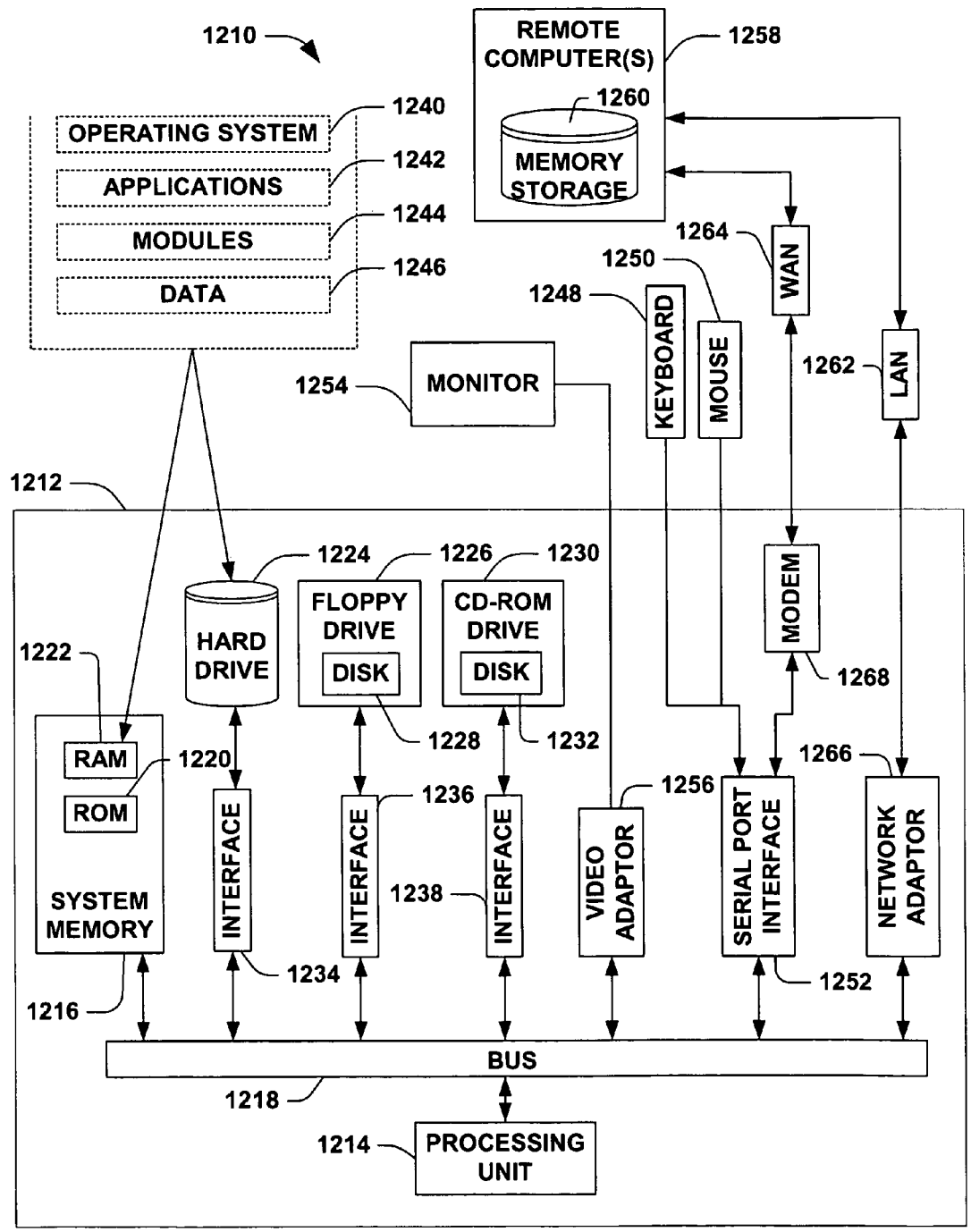
FIG. 12 is a schematic block diagram of an exemplary operating environment for a system configured in accordance with the present invention.

FIG. 12 is a schematic block diagram of an exemplary operating environment for a system configured in accordance with the present invention. In order to provide additional context for various aspects of the present invention, FIG. 12 and the following discussion are intended to provide a brief, general description of a suitable computing environment 1210 in which the various aspects of the present invention may be implemented. While the invention has been described above in the general context of computer-executable instructions that may run on one or more computers, those skilled in the art will recognize that the invention also may be implemented in combination with other program modules and/or as a combination of hardware and software. Generally, program modules include routines, programs, components, data structures, etc. that perform particular tasks or implement particular abstract data types. Moreover, those skilled in the art will appreciate that the inventive methods may be practiced with other computer system configurations, including single-processor or multi-processor computer systems, minicomputers, mainframe computers, as well as personal computers, hand-held computing devices, microprocessor-based or programmable consumer electronics, and the like, each of which may be operatively coupled to one or more associated devices. The illustrated aspects of the invention may also be practiced in distributed computing environments where certain tasks are performed by remote processing devices that are linked through a communications network. In a distributed computing environment, program modules may be located in both local and remote memory storage devices.

With reference to FIG. 12, an exemplary environment 1210 for implementing various aspects of the invention includes a computer 1212, the computer 1212 including a processing unit 1214, a system memory 1216 and a system bus 1218. The system bus 1218 couples system components including, but not limited to, the system memory 1216 to the processing unit 1214. The processing unit 1214 may be any of various commercially available processors. Dual microprocessors and other multi-processor architectures also can be employed as the processing unit 1214.

The system bus 1218 can be any of several types of bus structure including a memory bus or memory controller, a peripheral bus and a local bus using any of a variety of commercially available bus architectures. The system memory 1216 includes read only memory (ROM) 1220 and random access memory (RAM) 1222. A basic input/output system (BIOS), containing the basic routines that help to transfer information between elements within the computer 1212, such as during start-up, is stored in ROM 1220.

The computer 1212 further includes a hard disk drive 1224, a magnetic disk drive 1226, (e.g., to read from or write to a removable disk 1228) and an optical disk drive 1230, (e.g., for reading a CD-ROM disk 1232 or to read from or write to other optical media). The hard disk drive 1224, magnetic disk drive 1226 and optical disk drive 1230 can be connected to the system bus 1218 by a hard disk drive interface 1234, a magnetic disk drive interface 1236 and an optical drive interface 1238, respectively. The drives and their associated computer-readable media provide nonvolatile storage of data, data structures, computer-executable instructions, etc. for the computer 1212, including for the storage of broadcast programming in a suitable digital format. Although the description of computer-readable media above refers to a hard disk, a removable magnetic disk and a CD, it should be appreciated by those skilled in the art that other types of media which are readable by a computer, such as zip drives, magnetic cassettes, flash memory cards, digital video disks, cartridges, and the like, may also be used in the exemplary operating environment, and further that any such media may contain computer-executable instructions for performing the methods of the present invention.

A number of program modules can be stored in the drives and RAM 1222, including an operating system 1240, one or more application programs 1242, other program modules 1244 and program data 1246. It is to be appreciated that the present invention can be implemented with various commercially available operating systems or combinations of operating systems.

A user can enter commands and information into the computer 1212 through a keyboard 1248 and a pointing device, such as a mouse 1250. Other input devices (not shown) may include a microphone, an IR remote control, a joystick, a game pad, a satellite dish, cameras, in the sense of gesture interpreted through cameras and machine-vision software, a scanner, or the like. These and other input devices are often connected to the processing unit 1214 through a serial port interface 1252 that is coupled to the system bus 1218, but may be connected by other interfaces, such as a parallel port, a game port, a universal serial bus ("USB"), an IR interface, etc. A monitor 1254 or other type of display device is also connected to the system bus 1218 via an interface, such as a video adapter 1256. In addition to the monitor, a computer typically includes other peripheral output devices (not shown), such as speakers, printers etc.

The computer 1212 may operate in a networked environment using logical connections to one or more remote computers, such as a remote computer(s) 1258. The remote computer(s) 1258 may be a workstation, a server computer, a router, a personal computer, microprocessor based entertainment appliance, a peer device or other common network node, and typically includes many or all of the elements described relative to the computer 1212, although, for purposes of brevity, only a memory storage device 1260 is illustrated. The logical connections depicted include a local area network (LAN) 1262 and a wide area network (WAN) 1264. Such networking environments are commonplace in offices, enterprise-wide computer networks, intranets and the Internet.

When used in a LAN networking environment, the computer 1212 is connected to the local network 1262 through a network interface or adapter 1266. When used in a WAN networking environment, the computer 1212 typically includes a modem 1268, or is connected to a communications server on the LAN, or has other means for establishing communications over the WAN 1264, such as the Internet. The modem 1268, which may be internal or external, is connected to the system bus 1218 via the serial port interface 1252. In a networked environment, program modules depicted relative to the computer 1212, or portions thereof, may be stored in the remote memory storage device 1260. It will be appreciated that the network connections shown are exemplary and other means of establishing a communications link between the computers may be used.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A semiconductor lithography defect solution system, comprising:
   a defect solution component that identifies at least one potential solution associated with a semiconductor lithography defect, the defect solution component employing an artificial intelligence technique to identify the at least one potential solution;
   a defect alert component coupled to the defect solution component, the defect alert component providing information associated with the semiconductor lithography defect and the at least one potential solution; and,
   a corrective action component that automatically implements the at least one possible solution if a calculated likelihood of correctness associated with the at least one potential solution is above a pre-defined threshold.

2. The semiconductor lithography defect solution system of claim 1 employing a Bayesian decision-making methodology in identifying the at least one potential solution.

3. The semiconductor lithography defect solution system of claim 1, the defect solution component employing at least one of a Bayesian learning method, a Bayesian classifier, a decision tree learning method, a support vector machine, and a neural network.

4. The semiconductor lithography defect solution system of claim 1, the defect alert component further comprising an output device.

5. The semiconductor lithography defect solution system of claim 4, the output device comprising at least one of a computer monitor, a television screen, a touch screen, a speaker, a telephone and a personal digital assistant.

6. The semiconductor lithography defect solution system of claim 1, further comprising an input device.

7. The semiconductor lithography defect solution system of claim 6, the input device comprising at least one of a mouse, a microphone, a keyboard, a touch screen, a telephone and a personal digital assistant.

8. The semiconductor lithography defect solution system of claim 1, further comprising a defect detector that detects the defect.

9. The semiconductor lithography defect solution system of claim 8, the defect detector providing at least one of an electrical signal and a digital image associated with the defect to the defect solution component.

10. The semiconductor lithography defect solution system of claim 1, further comprising a defect/solution data store storing a plurality of defects and information associated with potential solutions to the plurality of defects, the defect/solution data store coupled to the defect solution component.

11. The semiconductor lithography defect solution system of claim 1, the corrective action component being user configurable, the pre-defined threshold is selected by a user.

12. The semiconductor lithography defect solution system of claim 1, the defect solution component further comprising a defect/solution analyzer that provides the at least one potential solution for the defect.

13. The semiconductor lithography defect solution system of claim 1, the defect solution component further comprising a solution/recorder editor that records the at least one potential solution.

14. The semiconductor lithography defect solution system of claim 13, the solution/recorder editor facilitating editing of information stored in a defect/solution data store.

15. The semiconductor lithography defect solution system of claim 1, the corrective action component configurable to at least one of automatic, semi-automatic, and manual corrective action modes.

16. The semiconductor lithography defect solution system of claim 15, the corrective action component in automatic mode implementing a solution from the at least one potential solution, based upon a calculated likelihood of correctness.

17. The semiconductor lithography defect solution system of claim 15, the corrective action component in manual mode providing a user with a list of potential solutions and facilitating user selection and implementation of a solution from the list.

18. The semiconductor lithography defect solution system of claim 17, the corrective action component in manual mode facilitating the user entering a new solution for the defect and implementing the new solution.

19. A method for providing solutions to semiconductor lithography defects, comprising:
   receiving information associated with a semiconductor lithography defect;
   analyzing the information associated with the defect using an artificial intelligence technique in order to identify at least one potential solution; and,
   providing information associated with the at least one potential solution, the information comprising a calculated compatibility percentage between the at least one potential solution and the defect.

20. The method of claim 19, further comprising at least one of the following acts:
   requesting information regarding at least one potential solution from at least one of a user and a remote system, if the artificial intelligence analysis determines that at least one potential solution does not exist;
   receiving information regarding at least one potential solution; and,
   recording information regarding the defect and the at least one potential solution.

21. The method of claim 19, the artificial intelligence technique including a Bayesian decision-making methodology.

22. A semiconductor lithography defect solution system, comprising:
   means for receiving information associated with a semiconductor lithography defect;
   means for identifying at least one potential solution to the defect utilizing an artificial intelligence technique; and,
   means for providing information associated with the at least one potential solution regarding whether a calculated likelihood of correctness associated with the at least one potential solution is above a defined threshold.

23. A data communication between two or more computer components that facilitates semiconductor lithography defect solution, the data communication comprising;
   a first data field comprising information associated with a potential solution to a semiconductor lithography defect, the potential solution based, at least in part, upon an analysis of the defect, the analysis employing an artificial intelligence technique, the potential solution automatically implemented if a calculated likelihood of correctness associated with the potential solution is above a pre-defined threshold.

24. A computer readable medium storing computer executable components of a semiconductor lithography defect solution system, comprising:
   a defect solution component that identifies at least one potential solution associated with a semiconductor lithography defect, the defect solution component employing an artificial intelligence technique to identify the at least one potential solution; and,
   a defect alert component that provides information associated with the defect and the at least one potential solution, the information comprises a calculated compatibility percentage between the at least one potential solution and the defect.

25. A system that facilitates defect detection and resolution in a semiconductor lithography environment, comprising:
   a defect detection component that detects a defect(s) associated with a semiconductor lithographic process; and
   a defect solution component that employs an artificial intelligence technique to provide a solution in connection with the detected defect(s), the solution provided as a function of a calculated compatibility percentage between the solution and the detected defect.

26. The system of claim 25, the defect detection component identifying formation of microbubble(s).

27. The system of claim 25, the defect detection component identifying formation of developer spot(s).

28. The system of claim 25, the defect detection component identifying formation of developer residue.

29. The system of claim 25, the defect solution component employing a probabilistic-based analysis in connection with determining a suitable solution.

30. The system of claim 25, the defect solution component employing a statistical-based analysis in connection with determining a suitable solution.

31. The system of claim 25, the defect detection component identifying formation of defect(s) in a resist.

* * * * *